US012763769B2

(12) United States Patent
Miao et al.

(10) Patent No.: US 12,763,769 B2
(45) Date of Patent: Oct. 13, 2026

(54) MANAGING ZQ CALIBRATION IN MEMORY DEVICES

(71) Applicant: Yangtze Memory Technologies Co., Ltd., Wuhan (CN)

(72) Inventors: Lin Miao, Wuhan (CN); Han Qin, Wuhan (CN); Lei Jia, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 27 days.

(21) Appl. No.: 18/791,254

(22) Filed: Jul. 31, 2024

(65) Prior Publication Data

US 2025/0385672 A1 Dec. 18, 2025

(30) Foreign Application Priority Data

Jun. 13, 2024 (CN) ......................... 202410758900.6

(51) Int. Cl.
*H03K 19/00* (2006.01)
*G11C 16/04* (2006.01)
*G11C 16/06* (2006.01)

(52) U.S. Cl.
CPC ......... *H03K 19/0005* (2013.01); *G11C 16/06* (2013.01); *G11C 16/0483* (2013.01)

(58) Field of Classification Search
CPC .................................................. H03K 19/0005
See application file for complete search history.

(56) References Cited

U.S. PATENT DOCUMENTS

2005/0040845 A1* 2/2005 Park .................... H04L 25/0278 326/30
2008/0211534 A1* 9/2008 Jeong ................. H03K 19/0005 326/30
2014/0266299 A1* 9/2014 Seol .................. H03K 19/0005 326/30
2022/0165321 A1* 5/2022 Seo .......................... G11C 7/04
2022/0321122 A1* 10/2022 Zhang .............. G11C 29/50008
2024/0086347 A1* 3/2024 Mahmoodi ......... G06F 13/1694
2024/0212746 A1* 6/2024 Jung .................. H03K 19/0005
2024/0290378 A1* 8/2024 Chung ................ G11C 11/4093
2025/0191623 A1* 6/2025 Hong ................... G11C 7/1084
2025/0218483 A1* 7/2025 Fujimaki .............. G11C 7/1057
2025/0218502 A1* 7/2025 Fujimaki ............. G11C 11/4096
2025/0385672 A1* 12/2025 Miao .................. H03K 19/0005

OTHER PUBLICATIONS

Intel Corporation et al., "Open NAND Flash Interface Specification, Revision 5.1," Open NAND Flash Interface (ONFI), May 3, 2022, 398 pages.

* cited by examiner

*Primary Examiner* — Jason M Crawford
(74) *Attorney, Agent, or Firm* — Fish & Richardson P.C.

(57) ABSTRACT

Systems, devices, and methods for managing ZQ calibration in semiconductor devices are provided. In one aspect, a circuit includes a memory configured to provide an offset code and a logic circuit. The logic circuit is configured to receive a ZQ calibration code as a first input and the offset code as a second input, and provide a resistor code as an output based on the ZQ calibration code and the offset code.

20 Claims, 7 Drawing Sheets

MANAGING ZQ CALIBRATION IN MEMORY DEVICES

CROSS-REFERENCE TO RELATED APPLICATIONS

This application claims priority to Chinese Patent Application No. 202410758900.6, filed on Jun. 13, 2024, which is hereby incorporated by reference in its entirety.

TECHNICAL FIELD

The present disclosure relates to memory devices.

BACKGROUND

Semiconductor memory devices may be classified into non-volatile memory devices, such as NAND flash memory devices, and volatile memory devices. The semiconductor memory devices can have different structures with different densities of memory cells and lines on a chip. A memory device normally includes a memory array of memory cells and control circuitries. The control circuitries can facilitate operations of the memory array. NAND Flash memory can have its data bus operating with double data rate (DDR), transferring data on both the rising and falling edges of the block signal, also known as the toggle mode. Various versions of DDR standards, such as DDR2, DDR3, DDR4, etc., have been introduced to achieve higher bus speed and lower power.

SUMMARY

The present disclosure describes methods, devices, circuits, systems and techniques for managing impedance equilibrium (ZQ) calibration in memory devices.

One aspect of the present disclosure features a circuit, including a memory configured to provide an offset code; and a logic circuit. The logic circuit is configured to receive a ZQ calibration code as a first input and the offset code as a second input, and provide a resistor code as an output based on the ZQ calibration code and the offset code.

In some implementations, the logic circuit is configured to convert the ZQ calibration code to the resistor code by performing at least one of add, subtract, or shift on the ZQ calibration code.

In some implementations, the resistor code is a sum of the ZQ calibration code and the offset code.

In some implementations, the resistor code is a difference of the ZQ calibration code and the offset code.

In some implementations, a number of digits of the offset code is less than or equal to a number of digits of the ZQ calibration code.

In some implementations, the offset code includes one binary digit, two binary digits or three binary digits.

In some implementations, the offset code includes at least one of a factory default value or a user-defined value.

In some implementations, the memory is configured to receive the offset code and store the offset code.

In some implementations, the memory includes a register.

In some implementations, the logic circuit includes at least one of an adder, a subtractor, or a shifter.

In some implementations, the resistor code is a RON_CODE, and the circuit is configured to provide the RON_CODE to one or more resistors to output data from a memory array.

In some implementations, the resistor code is a RTT_CODE, and the circuit is configured to provide the RTT_CODE to one or more resistors to input data to a memory array.

In some implementations, the circuit is configured to receive the ZQ calibration code from a ZQ calibration circuit.

Another aspect of the present disclosure features a method including: receiving, as a first input of a logic circuit, a ZQ calibration code; receiving, as a second input of the logic circuit, an offset code from a memory; and providing, as an output of the logic circuit, a resistor code based on the ZQ calibration code and the offset code.

In some implementations, providing, as the output of the logic circuit, the resistor code includes: converting the ZQ calibration code to the resistor code by performing at least one of add, subtract, or shift on the ZQ calibration code In some implementations, the resistor code is a sum of the ZQ calibration code and the offset code.

In some implementations, the resistor code is a difference of the ZQ calibration code and the offset code.

In some implementations, the offset code includes one binary digit, two binary digits or three binary digits.

In some implementations, a number of digits of the offset code is less than or equal to a number of digits of the ZQ calibration code.

In some implementations, the offset code includes at least one of a factory default code or a user-defined code.

In some implementations, the method includes transmitting the resistor code to a buffer circuitry; and adjusting a resistance of one or more resistors in the buffer circuitry based on the resistor code.

In some implementations, the resistor code is a RON_CODE. Adjusting the resistance of the one or more resistors in the buffer circuitry based on the resistor code includes: adjusting the resistance of the one or more resistors in the buffer circuitry based on the RON_CODE to output data from a memory array.

In some implementations, the resistor code is a RTT_CODE. Adjusting the resistance of the one or more resistors in the buffer circuitry based on the resistor code includes: adjusting the resistance of the one or more resistors in the buffer circuitry based on the RTT_CODE to input data to a memory array.

Another aspect of the present disclosure features a memory system including: a memory device and a memory controller. The memory device is configured to store data and includes a memory array and a circuit. The circuit includes a memory configured to provide an offset code; and a logic circuit configured to receive a ZQ calibration code as a first input and the offset code as a second input, and provide a resistor code as an output based on the ZQ calibration code and the offset code. The memory controller is coupled to the memory device and configured to operate the memory device.

The details of one or more implementations of the subject matter of this present disclosure are set forth in the accompanying drawings and the description below. Other features, aspects, and advantages of the subject matter will become apparent from the description, the drawings, and the claims.

BRIEF DESCRIPTION OF THE DRAWINGS

The accompanying drawings, which are incorporated herein and form a part of the present disclosure, illustrate aspects of the present disclosure and, together with the description, further serve to explain the principles of the present disclosure and to enable a person of ordinary skill in the pertinent art to make and use the present disclosure.

Figure 1:
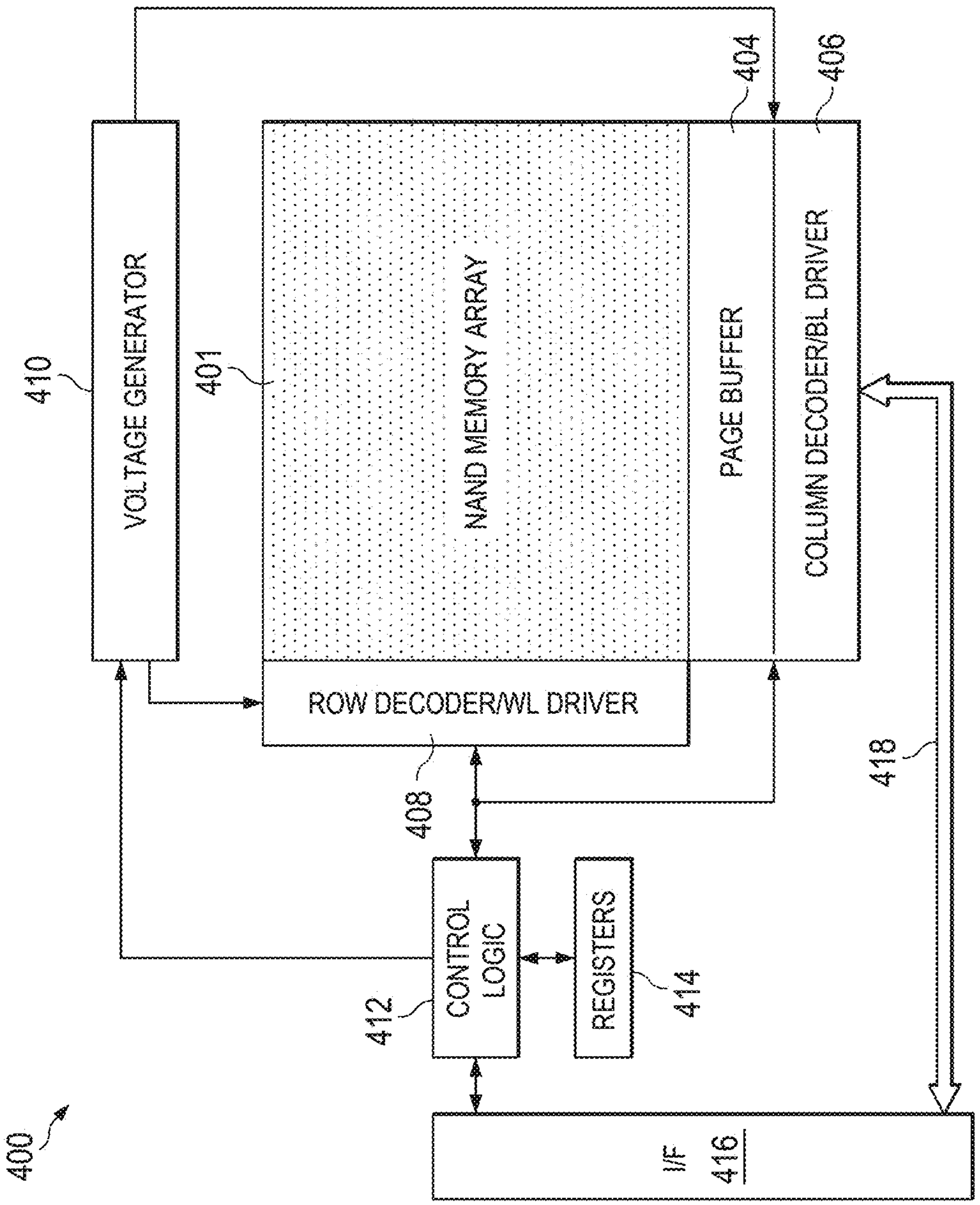
FIG. 1 illustrates an example NAND Flash memory device.

It is to be understood that the various exemplary implementations shown in the figures are merely illustrative representations and are not necessarily drawn to scale.

DETAILED DESCRIPTION

Memory cells can be arranged in a grid of rows and columns, and data is read from or written to these cells through input/output (I/O) lines. Impedance mismatches or variations in the I/O lines can lead to signal distortion, which can result in data errors, reduced read or write speeds, or even data corruption. Impedance equilibrium (ZQ) calibration in memory devices is a process used to adjust the impedance of the I/O (input/output) data lines to optimize signal integrity and reliability during read and write operations. However, in some situations, due to factors such as manufacturing process and package layout, there may be a mismatch error between a ZQ target value and a ZQ-calibrated output driver resistance (RON) or on die termination resistance (RTT), which can affect the signal integrity of the system.

Implementations of the present disclosure provide circuits and methods for managing ZQ calibration in memory devices. In some implementations, a circuit includes a memory configured to provide an offset code and a logic circuit. The logic circuit is configured to receive a ZQ calibration code as a first input and the offset code as a second input, and provide a resistor code as an output based on the ZQ calibration code and the offset code.

Implementations of the present disclosure can provide one or more of the following technical advantages and/or benefits. For example, by adjusting the ZQ calibration code with an offset code from a memory (e.g., a register), output driver resistance (RON) and on-die termination resistance (RTT) can be more precisely adjusted to a target value. In addition, the offset code can be a factory default code or a user-defined code. The flexibility of allowing the offset code to be either a factory default code or a user-defined code offers several benefits. For example, different users or applications may have unique requirements or preferences regarding signal integrity or performance optimization. Allowing user-defined codes enables them to tailor the calibration process to better suit their specific needs. In addition, system requirements or operating conditions may change over time. Allowing users to modify the offset code provides adaptability to accommodate these changes. On the other hand, providing a factory default code ensures that the calibration process is functional out-of-the-box for users who may not have specific requirements or preferences.

The techniques can be applied to various types of semiconductor devices, volatile memory devices, such as DRAM memory devices, or non-volatile memory (NVM) devices, such as NAND flash memory, NOR flash memory, resistive random-access memory (RRAM), phase-change memory (PCM) such as phase-change random-access memory (PCRAM), spin-transfer torque (STT)-Magnetoresistive random-access memory (MRAM), among others. The techniques can also be applied to charge-trapping based memory devices, e.g., silicon-oxide-nitride-oxide-silicon (SONOS) memory devices, and floating-gate based memory devices. The techniques can be applied to three-dimensional (3D) memory devices. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, among others.

FIG. 1 illustrates an example NAND Flash memory device 400, according to some aspects of the present disclosure. The NAND Flash memory 400 may be or include a three-dimensional (3D) NAND memory device 400. As shown in FIG. 1, NAND Flash memory device 400 can include a NAND memory array 401 including an array of NAND memory cells in the form of NAND memory strings. The NAND memory array 401 is described with further details below in reference to FIG. 2. NAND Flash memory 400 can also include peripheral circuits configured to facilitate the operations of NAND memory cells, such as read, program, and erase. The peripheral circuits can include, for example, a page buffer 404, a column decoder/bit line driver 406, a row decoder/word line driver 408, a voltage generator 410, control logic 412, registers 414, an interface 416, and a data bus 418. It is understood that in some examples, additional peripheral circuits may be included as well.

A calibration circuit 100 (e.g., as described below in reference to FIG. 3) can be part of the peripheral circuits and implemented in any suitable components of NAND Flash memory 400. For example, a memory 102 of the calibration circuit 100 can be implemented in the control logic 412 or the registers 414. A ZQC circuit 102, a logic circuit 106 and a buffer circuit 108 can be implemented in the interface 416.

Page buffer 404 can be configured to read and program data from and to NAND memory array 401 according to the control of control logic 412. In one example, page buffer 404 may store one page of program data (write data) to be programmed into one page of NAND memory array 401. In another example, page buffer 404 also performs program verify operations to ensure that the data has been properly programmed into memory cells coupled to selected word lines. Row decoder/word line driver 408 can be configured to be controlled by control logic 412 and select a block of NAND memory array 401 and a word line of the selected block. Row decoder/word line driver 408 can be further configured to drive the selected word line using a word line voltage generated from voltage generator 410. Voltage generator 410 can be configured to be controlled by control logic 412 and generate the word line voltages (e.g., read voltage, program voltage, pass voltage, local voltage, and verification voltage) to be supplied to NAND memory array 401. Column decoder/bit line driver 406 can be configured to be controlled by control logic 412 and select one or more NAND memory strings by applying bit line voltages generated from voltage generator 410. For example, column decoder/bit line driver 406 may apply column signals for selecting a set of N bits of data from page buffer 404 to be outputted in a read operation.

Control logic 412 can be coupled to each peripheral circuit and configured to control operations of peripheral circuits. Registers 414 can be coupled to control logic 412 and include status registers, command registers, and address registers for storing status information, command operation codes (OP codes), and command addresses for controlling the operations of each peripheral circuit.

Interface 416 can be coupled to control logic 412 and act as a control buffer to buffer and relay control commands received from a host (not shown) to control logic 412 and status information received from control logic 412 to the host. Interface 416 can also be coupled to page buffer 404 via column decoder/bit line driver 406 and act as an IO interface and a data buffer to buffer and relay the program data received from a host (not shown) to page buffer 404 and the read data from page buffer 404 to the host. As shown in FIG. 1, bidirectional data bus 418 can connect interface 416 and column decoder/bit line driver 406 for transferring data to and from NAND memory array 401.

Figure 2:
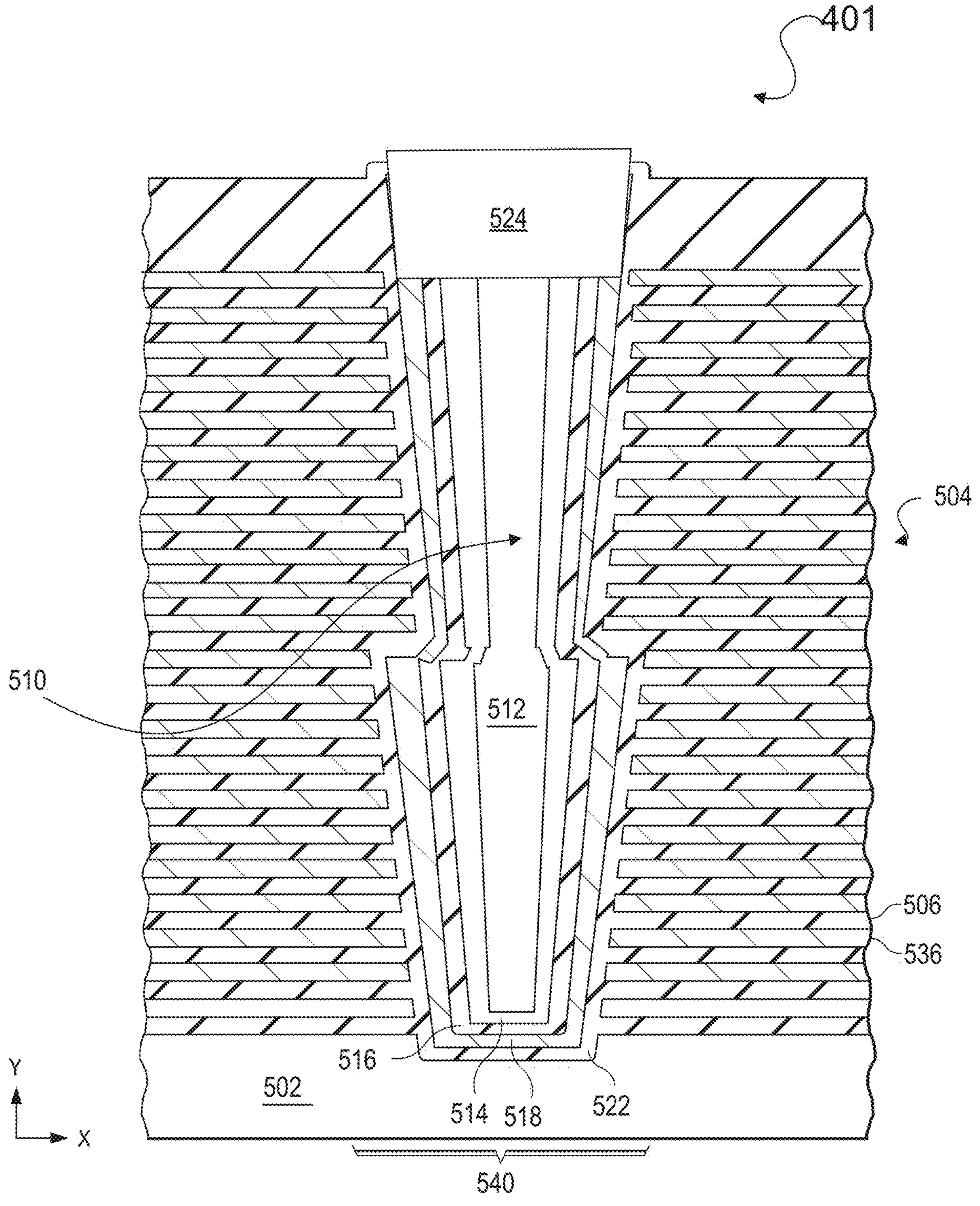
FIG. 2 illustrates a cross-section view of an example memory array in a NAND Flash memory device.

FIG. 2 illustrates a cross-section view of NAND memory cells in the memory array 401. The 3D NAND memory array 401 may include a substrate 502, which is a doped semiconductor layer and may include silicon (e.g., single crystalline silicon), silicon germanium (SiGe), gallium arsenide (GaAs), germanium (Ge), silicon on insulator (SOI), germanium on insulator (GOI), or any other suitable materials. In some implementations, substrate 502 is a thinned substrate (e.g., a semiconductor layer), which was thinned by grinding, etching, chemical mechanical polishing (CMP), or any combination thereof. Substrate 502 of 3D memory array 401 includes two surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory array 401) is determined relative to the substrate of the 3D memory device (e.g., substrate 502) in the y-direction (i.e., the vertical direction) when the substrate is positioned in the lowest plane of the 3D memory device in the y-direction.

In some implementations, 3D memory array 401 is a NAND Flash memory device in which memory cells are provided in the form of an array of NAND memory strings each extending vertically above substrate 502.

As shown in FIG. 2, 3D memory array 401 may include a stack structure 504 with interleaved gate lines 136 and first dielectric layer 106. The gate lines 136 may include conductive materials including, but not limited to, tungsten (W), cobalt (Co), copper (Cu), aluminum (Al), polysilicon, doped silicon, silicides, or any combination thereof. First dielectric layers 106 may include dielectric materials including, but not limited to, silicon oxide, silicon nitride, silicon oxynitride, or any combination thereof.

A select gate (SG) layer can be formed on top of the stack structure 504 which is isolated from the gate lines 536. The select gate layer can comprise a different conductive material than the gate lines. For example, the select gate layer can comprise doped polysilicon while the gate lines can comprise Tungsten (W). The NAND memory string may include one or more channel structures 510 extending vertically through both the stack structure 504 and the select gate layer 520 in the y-direction. In some implementations, there is an additional dielectric layer formed between the select gate layer and the stack structure 504.

Channel structures 510 may include a channel hole or a channel trench with a layered structure 540. In some implementations, the remaining space of channel structure 510 may be partially or fully filled with a filling layer 512 including dielectric materials, such as silicon oxide. In some implementations, the layered structure 540 comprises a blocking layer, a charge trapping layer (also called storage layer in some cases), a dielectric layer (also called a tunneling layer in some cases), and a semiconductor channel layer. The semiconductor channel layer 514 is in contact with and laterally surrounded by the dielectric layer 116. The dielectric layer 516 is in contact with and laterally surrounded by the charge trapping layer 518. The charge trapping layer 518 is in contact with and laterally surrounded by the blocking layer 522. In other words, the filling layer 512, semiconductor channel layer 514, dielectric layer 516, charge trapping layer 518, and blocking layer 522 can be arranged radially from the center toward the outer surface of the channel 510 in this order. The semiconductor channel layer 514 can include doped polysilicon or silicon germanium (SiGe). The dopants can be N type dopants (e.g., Phosphorus (P) or Arsenic (As)) or P type dopants (e.g., Boron (B) or Gallium (Ga)) at a desired doping level. Dielectric layer 516 may include silicon oxide, silicon oxynitride, or any combination thereof. Charge trapping layer 518 may include silicon nitride, silicon oxynitride, silicon, or any combination thereof. Blocking layer 522 may include silicon oxide, silicon oxynitride, high dielectric constant (high-k) dielectrics, or any combination thereof. In one example, the layered structure 540 can include silicon oxide/silicon oxynitride (or silicon nitride)/silicon oxide/polysilicon (ONOP), for the blocking layer 522, the charge trapping layer 518, the dielectric layer 516, and the semiconductor channel layer 514, respectively.

Channel structure 510 may have a cylinder shape (e.g., a pillar shape). In some implementations, channel structure 510 may be formed by stacking more than one cylinder structure, as shown in FIG. 2. It is understood that the channel structure 510 may have other shapes (e.g., elliptical cylinder or irregular shape).

In some implementations, channel structure 510 may further include a channel contact, or called semiconductor plug, in a lower portion (e.g., at the lower end) of channel structure 510 (not shown). As used herein, the "upper end" of a component (e.g., channel structure 510) is the end farther away from substrate 502 in the positive y-direction, and the "lower end" of the component (e.g., channel structure 510) is the end closer to substrate 502 in the negative y-direction. The channel contact may include a semiconductor material, such as silicon, which is epitaxially grown from substrate 502 in any suitable directions. It is understood that in some implementations, the channel contact includes single crystalline silicon, the same material as substrate 502. In other words, the channel contact may include an epitaxially-grown semiconductor layer that is the same as the material of substrate 502. In some implementations, part of the channel contact is above the top surface of substrate 502 and in contact with semiconductor channel layer 514. The channel contact may function as a channel controlled by a source select gate of the NAND memory string. It is understood that in some implementations, 3D memory array 401 does not include the channel contact, as shown in FIG. 2.

In some implementations, channel structure 510 further includes a channel plug 524 in an upper portion (e.g., at the upper end) of channel structure 510, which can be stacked over the layered structure 540. Channel plug 524 may be in contact with the upper end of semiconductor channel layer 514 of the layered structure 540. In some implementations, the channel plug 524 material can include, but not limited to, TiN, TaN, Al, W, Cu, doped-polysilicon, silicides, or any combination thereof. By covering the upper end of channel structure 510 during the fabrication of 3D memory array 401, channel plug 524 may function as an etch stop layer to prevent etching of dielectrics filled in channel structure 510, such as silicon oxide and silicon nitride. In some implementations, channel plug 524 functions as the drain of the NAND memory string. Channel plug 524 may also increase contact area for the landing of channel contact (not shown).

In some implementations, each gate line 536 in stack structure 504 (e.g., a memory stack) functions as a gate conductor of memory cells in the NAND memory string. Gate lines 536 may extend laterally coupling a plurality of memory cells. In some implementations, memory cell transistors in NAND memory string include semiconductor channel layer 514, memory film (including dielectric layer 516, charge trapping layer 518, and blocking layer 522), and the gate lines 536. The gate lines 536 may further include a gate conductor made from tungsten, adhesion layers including titanium/titanium nitride (Ti/TiN) or tantalum/tantalum nitride (Ta/TaN), and gate dielectric layers made from high-k dielectric materials. The gate lines 536 can be used to control the transistors in memory cells.

Figure 3:
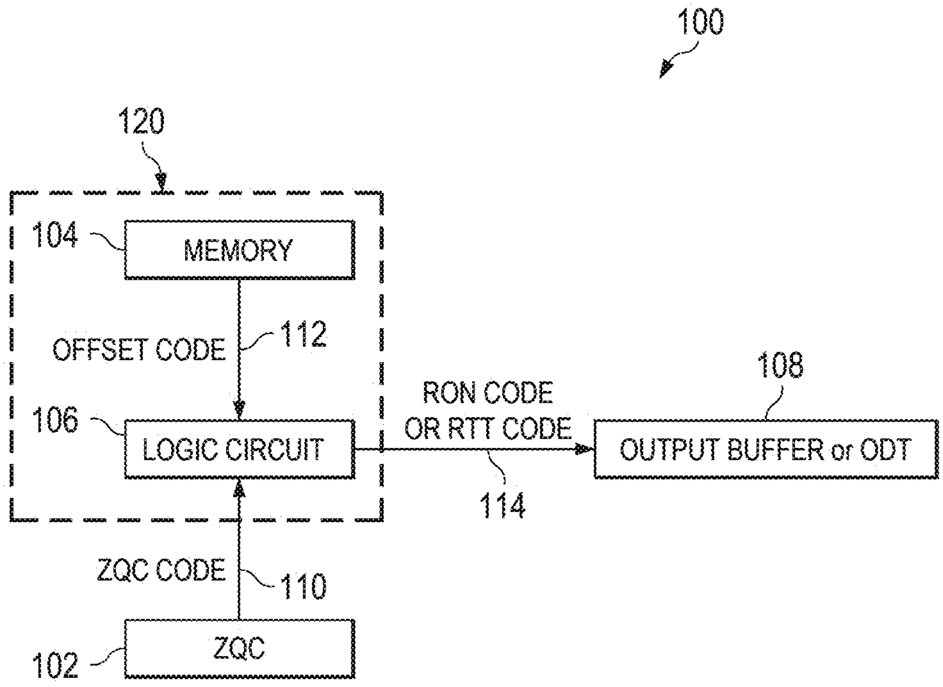
FIG. 3 illustrates a schematic diagram of an example calibration circuit in a memory device.

FIG. 3 illustrates a schematic diagram of an example calibration circuit 100, according to some aspects of the present disclosure. As illustrated, the calibration circuit 100 includes a ZQ calibration (ZQC) circuit 102. The ZQC circuit 102 can be configured to generate a ZQ calibration (ZQC) code 110 for adjusting the resistance of resistors or drivers in the output buffer (OB) or non-die termination (ODT) circuits. The ZQC circuit 102 is described with further details below in reference to FIG. 5. In some implementations, the ZQ calibration code 110 is a binary code with five, six or seven digits. The ZQ calibration can be based on protocols specified in Open NAND Flash Interface (ONFI) 5.0. The calibration circuit 100 can support double data rate 3 (DDR3) standard and DDR4 standard.

The calibration circuit 100 includes an adjustment circuit 120. The adjustment circuit 120 includes a memory 104 configured to provide an offset code 112. In some implementations, the memory 104 is a register. In some implementations, the memory 104 is a general-purpose register, or a shift register. In some implementations, the memory 104 is a one-time programmable memory (OTP) or multi-time programmable memory (MTP). The OTP and/or MTP can include fuse and/or anti-fuse. In some implementations, a number of digits of the offset code 112 is less than or equal to a number of digits of the ZQ calibration code 110. In some implementations, the offset code 112 includes one binary digit, two binary digits or three binary digits.

In some implementations, the offset code 112 is a factory default code. For example, the offset code 112 can be a preset code that is assigned to the memory 104 by the manufacturers. In some implementations, the offset code 112 is a user-defined code. The user-defined code can be a code that is set by a user themselves rather than being preassigned by the manufacturer. In some implementations, the memory 104 is configured to receive the offset code 112 (e.g., from a user) and store the offset code 112. As described with further details below in reference to FIG. 4, users may assemble a memory device that includes the calibration circuit 100 in various packages that may exhibit different impedance characteristics. Implementation of this disclosure can allow users to customize their offset code 112 in the memory 104 to suit their specific needs. For instance, users may undertake a calibration process to determine the required adjustment for the resistance of OB and/or ODT. Once determined, these adjustments can be stored within the memory 104 (e.g., a register) in a form of the offset code 112, enabling fine tune of the ZQC code 110 to obtain a resistor code 114. Subsequently, the resulting resistor code 114 can be employed to modify the resistors in OB and/or ODT circuits to achieve a desired target value.

The adjustment circuit 120 includes a logic circuit 106 configured to receive the ZQC code 110 as a first input and the offset code 112 as a second input. The logic circuit 106 provides a resistor code 114 as an output based on the ZQ calibration code 110 and the offset code 112. In some implementations, the logic circuit 106 includes an adder, a subtractor, or a shifter. The adder can be, e.g., a ripple carry adder, a carry lookahead adder, or any other suitable circuit which can take two binary numbers as input and produce their sum. The subtractor can be, e.g., ripple borrow subtractor, borrow lookahead subtractor, or any other suitable circuit which can take two binary numbers as input and perform subtraction of these two binary numbers. The shifter can be, e.g., serial-in serial-out (SISO) shift register, parallel-in serial-out (PISO) shift register, serial-in parallel-out (SIPO) shift register, parallel-in parallel-out (PIPO) shift register, or any other suitable circuit which can shift the bits of a binary number left or right by a certain number of positions.

In some implementations, the resistor code 114 is a binary code. In some implementations, a number of digits of the resistor code 114 is equal to a number of digits of the ZQ calibration code 110. In some implementations, the logic circuit 106 is configured to convert the ZQ calibration code 110 to the resistor code 114 by performing at least one of add, subtract, or shift on the ZQ calibration code 110. In some implementations, the resistor code 114 is a sum of the ZQ calibration code 110 and the offset code 112. In some implementations, the resistor code 114 is a difference of the ZQ calibration code 110 and the offset code 112.

In some implementations, the resistor code 114 is a RON_CODE, and the adjustment circuit 120 is configured to provide the RON_CODE to one or more resistors in the output buffer (OB) 108. The RON_CODE can be used to adjust the resistance of the one or more resistors in the OB 108 for impedance matching.

In some implementations, the resistor code 114 is a RTT_CODE, and the adjustment circuit 120 is configured to provide the RTT_CODE to one or more resistors in the on-die termination (ODT) 108. The RTT_CODE can be used to adjust the resistance of the one or more resistors the in ODT 108 for impedance matching. Impedance matching can help reduce signal distortion, improve signal integrity, and reduce the likelihood of data errors in high-speed memory systems.

In some implementations, the OB and ODT are the same circuit but for different purposes. For example, the buffer circuit 108 can be used as an OB for outputting a data from a memory array (e.g., the NAND memory array 401 in FIGS. 1 and 2). The buffer circuit 108 can be used as the ODT for inputting a data to the memory array 401. In some implementations, OB and ODT can be different circuits.

In some implementations, the RON_CODE is different from the RTT_CODE. In some implementations, the buffer circuit 108 has 8 resistors (also called drivers in some situations). In some implementations, a resistor is adjusted to about 300 ohms based on the RON_CODE or RTT_CODE. In some implementations, each resistor includes five to seven Metal-Oxide-Semiconductor Field-Effect Transistors (MOSFET), and the resistor code 114 is used to control the switching of the MOSFETs between on and off states to adjust the resistance of the resistor. In some implementations, different resistors in the buffer circuit 108 can be arranged either in parallel, series, or a combination of both to obtain an equivalent resistance. In some implementations, the equivalent resistance for OB (RON) is 50 ohms. In some implementations, the equivalent resistance for ODT (RTT) is 150 ohms.

Figure 4:
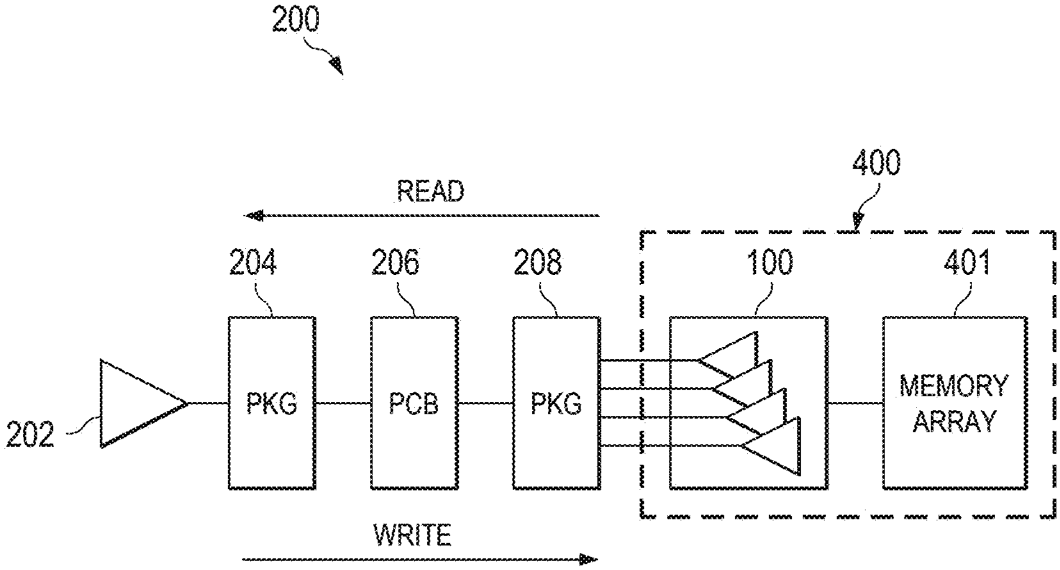
FIG. 4 illustrates a schematic view of an example package system with a memory device.

FIG. 4 illustrates a schematic view of an example package system 200 with a memory device 400, according to some aspects of the present disclosure. In the example package system 200, the memory device 400 is coupled to a memory controller 202 through a printed circuit board (PCB) 206. The memory device 400 can include the calibration circuit 100 and the memory array 401. As described above in reference to FIG. 1, the calibration circuit 100 can be part of peripheral circuits used to control the operations of the memory array 401.

In some implementations, the memory device 400 is assembled in a first package 208, and the memory controller 202 is assembled in a second package 204. The first package 208 and the second package 204 can be electrically coupled through the PCB 206.

In double data rate (DDR) memory systems, signals are transmitted between the memory controller 202 and the memory device 400 through traces on the PCB 206 and/or the packages, 204, 208. These signals experience impedance mismatches due to the difference in impedance between the memory controller 202, the traces, and the memory device 400. When a signal reaches the end of the transmission line (either at the memory controller 202 or the memory device 400), reflections can occur due to these impedance mismatches. These reflections can cause signal degradation, leading to data errors and reduced performance. Therefore, impedance matching can be a critical part of high-speed PCB design, as it can ensure effective signal transmission and preserve signal integrity by reducing the signal reflections and distortion. The standard impedance of the PCB 206 and/or packages 204, 208 can be around 45 ohms to 50 ohms. The calibration circuit 100 can be used to adjust the resistance of the buffer circuit 108 (e.g., OB or ODT) for impedance matching between the memory array 401 and transmission lines.

Various factors can affect impedance matching in a package system 200, such as the length and routing of interconnects, the material properties of packages and PCBs 206, and the design of vias for signal transition between PCB layers. Therefore, users' package systems may vary, resulting in differing impedance characteristics. As noted above, implementation of this disclosure can allow users to customize their offset code 112 in the memory 104, according to their specific requirements. For instance, once users assemble the memory device 400 alongside other chips or packages, they may undertake a calibration to determine the adjustments required to match the impedance of memory device 400 with transmission lines or other components. This adjustment (e.g., in a form of the offset code 112) can then be encoded into the memory 104 (e.g., a register) to fine-tune the ZQC code 110 through the logic circuit 106. Therefore, a customized resistor code 114, e.g., RTT_CODE and/or RON_CODE, can be obtained to adjust the output driver resistance (RON) or on die termination resistance (RTT) to meet a target value.

In some implementations, adjusting the ZQC code 110 by adding +4 (e.g., offset code 112) improves the read eye width of the package system 200 by 18.1 ps. This can be equivalent to extending the eye width by 6.5% of one unit interval (UI) at a data rate of 3.6 gigabits per second (Gbps). Increasing the eye width can improve the margin for reliable signal detection and thus improve the signal integrity.

Figure 5:
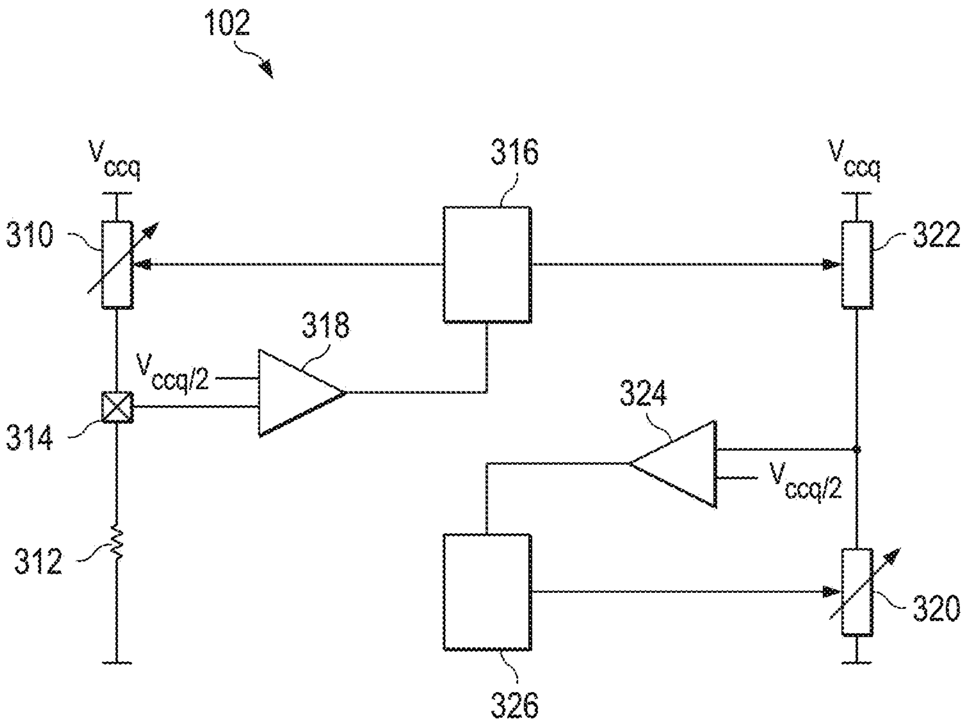
FIG. 5 illustrates an example ZQ calibration circuit.

FIG. 5 illustrates an example implementation of the ZQC circuit 102, according to some aspects of the present disclosure. The ZQC circuit 102 in a NAND flash memory device 400 can adopt a two-step calibration. In the first step, a pull-up driver 310 can be calibrated against an external reference resistor 312 applied to a resistor input 314. Pull-up driver 310 can be calibrated to 300Ω. The external reference resistor 312 is a 300Ω resistor in this example. The calibration can be performed by a logic pull-up code generator 316 based on a comparison result made by a first comparator 318. In the second step, a pull-down driver 320 can be calibrated against a replica 322 of pull-up driver 310 calibrated in the first step. Both pull-down driver 320 and replica 322 can be calibrated to 300Ω. The calibration can be performed by a logic pull-down code generator 326 based on a comparison result made by a second comparator 324. The reference voltage of the calibration for each of first comparator 318 and second comparator 324 can be half of the supply voltage, namely Vccq/2.

The example of FIG. 5 provides two examples (pull-down driver 320 and pull-up driver 310) of how a logic code generator can be used in connection with various pull-up and pull-down drivers. This example is not limiting, but merely provides a context. For example, the output of first comparator 318 may serve as a ZQ calibration input to a logic code generator to generate a ZQC. Similarly, the output of second comparator 324 may serve as a ZQ calibration input to another logic code generator. In this case, because pull-up driver 310 is a pull-up driver, while pull-down driver 320 is a pull-down driver, they may use different logic code generators. On the other hand, replica 322 may use a same resistor code 114 as pull-up driver 310.

As noted above, the pull-up driver 310 or pull-down driver 320 in the ZQC circuit 102 may not perfectly match those of the OB or ODT circuit 108 due to factors like manufacturing inconsistencies. Consequently, the ZQC code 110 generated by the ZQC circuit 102 may not achieve the target resistance after adjustment in the buffer circuit 108 (e.g., OB or ODT). Moreover, the targe value for resistors may vary slightly based on the different impedance matching requirements in various assembled packages. The implementation of this disclosure can address this issue by the adjustment circuit 120, which can be used to tune the ZQC code 110 to compensate for these discrepancies and achieve a better impedance matching.

Figure 6:
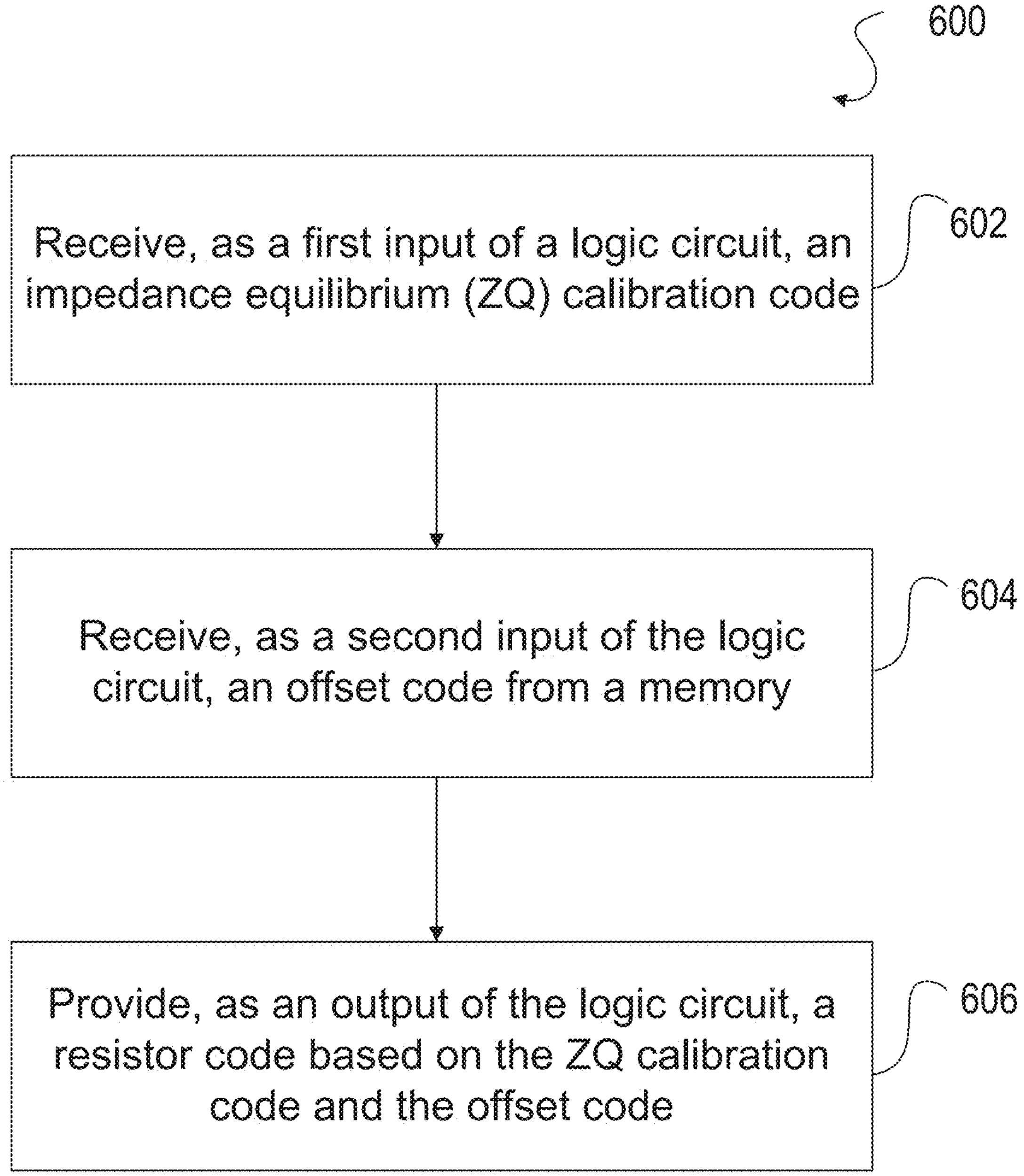
FIG. 6 illustrate a flow chart of an example process for managing ZQ calibration.

FIG. 6 illustrate a flow chart of an example process 600 for managing ZQ calibration in a circuit. The circuit can be, e.g., the adjustment circuit 120 of FIG. 3, or the calibration circuit 100 of FIG. 3. The example process 600 can be compatible with DDR3 and DDR4.

At step 602, a ZQ calibration code is received as a first input of a logic circuit. The ZQ calibration code can be, e.g., the ZQ calibration code 110 in FIG. 3. The logic circuit can be, e.g., the logic circuit 106 of FIG. 3.

At step 604, an offset code from a memory is received as a second input of the logic circuit. The offset code can be, e.g., the offset code 112 of FIG. 3. The memory can be, e.g., the memory 104 of FIG. 3. The memory 104 can be a register.

In some implementations, a number of digits of the offset code is less than or equal to a number of digits of the ZQ calibration code. In some implementations, the offset code includes one binary digit, two binary digits or three binary digits. In some implementations, the offset code is at least one of a factory default code or a user-defined code.

At step 606, a resistor code is provided based on the ZQ calibration code and the offset code as an output of the logic circuit. The resistor code can be, e.g., the resistor code 114 of FIG. 3. In some implementations, the ZQ calibration code 110 is converted to the resistor code 114 by performing at least one of add, subtract, or shift on the ZQ calibration code 110. In some implementations, the resistor code 114 is a sum of the ZQ calibration code 110 and the offset code 112. In some implementations, the resistor code 114 is a difference of the ZQ calibration code 110 and the offset code 112.

In some implementations, the resistor code 114 is transmitted to a buffer circuitry. The buffer circuitry can be, e.g., the buffer circuit 108 of FIG. 3. In some implementations, the buffer circuit 108 can be an OB or an ODT. In some implementations, a resistance of one or more resistors in the buffer circuitry is adjusted based on the resistor code 114. In some implementations, the resistor code 114 is a RON_CODE. The resistance of the one or more resistors in the buffer circuitry is adjusted based on the RON_CODE to output data from a memory array. In some implementations, the resistor code 114 is a RTT_CODE. The resistance of the one or more resistors in the buffer circuitry is adjusted based on the RTT_CODE to input data to a memory array. The memory array can be, e.g., the memory array 401 of FIGS. 1 and 2.

Figure 7:
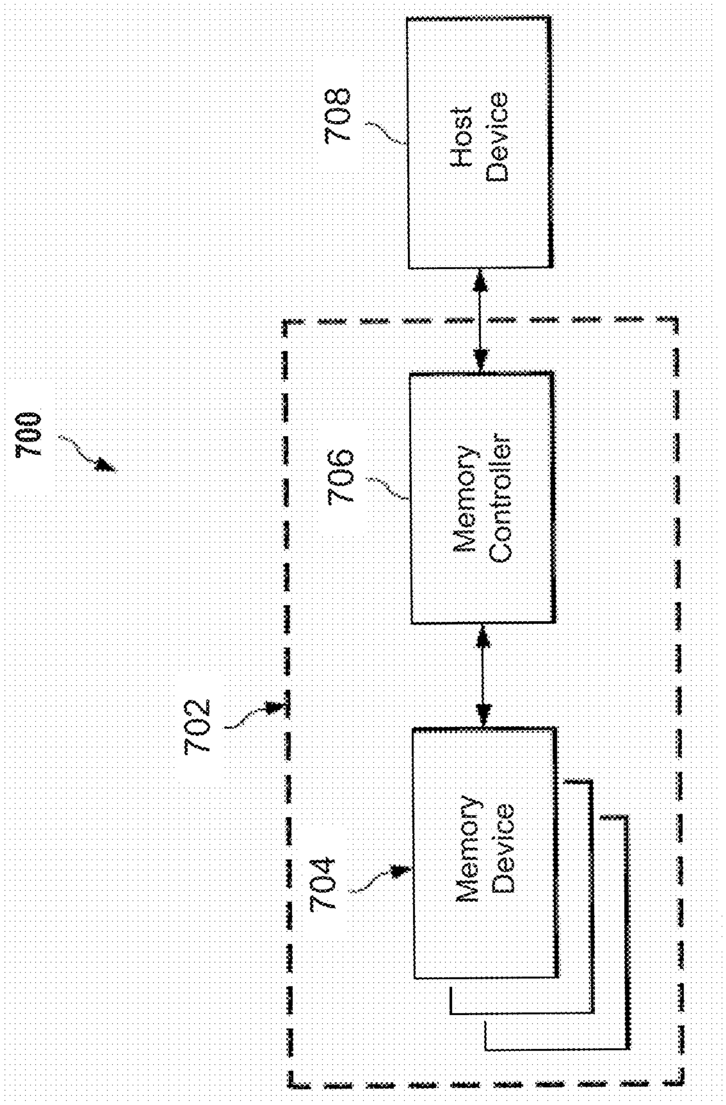
FIG. 7 illustrates a block diagram of an example system.

FIG. 7 illustrates a block diagram of a system 700 having one or more semiconductor devices (e.g., memory devices), according to one or more implementations of the present disclosure. The system 700 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 7, the system 700 can include a host device 708 and a memory system 702 having one or more 3D memory devices 704 and a memory controller 706. Host device 708 can include a processor of an electronic device, such as a central processing unit (CPU), or a system-on-chip (SoC), such as an application processor (AP). Host device 708 can be configured to send or receive data to or from the one or more 3D memory devices 704.

A 3D memory device 704 can be the memory device 400 of FIG. 1, or the memory array 401 of FIGS. 1 and 2. In some implementations, a 3D memory device 704 includes a NAND Flash memory. Memory controller 706 (a.k.a., a controller circuit) is coupled to 3D memory device 704 and host device 708. Consistent with implementations of the present disclosure, 3D memory device 704 can include a plurality of conductive interconnections through a cover layer that are in contact with conductive pads in a conductive pad layer, and memory controller 706 can be coupled to 3D memory device 704 through at least one of the plurality of conductive interconnections. Memory controller 706 is configured to control 3D memory device 704. For example, memory controller 706 may be configured to operate a plurality of channel structures via word lines. Memory controller 706 can manage data stored in 3D memory device 704 and communicate with host device 708. The memory controller 704 can be implemented as the memory controller 202 in FIG. 4.

In some implementations, memory controller 706 is designed/configured for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 706 is designed/configured for operating in a high duty cycle environment SSDs or embedded multi-media-cards (eMMCs) used as data storage for mobile devices, such as smartphones, tablets, laptop computers, etc., and enterprise storage arrays. Memory controller 706 can be configured to control operations of 3D memory device 704, such as read, erase, and program (or write) operations. Memory controller 706 can also be configured to manage various functions with respect to the data stored or to be stored in 3D memory device 704 including, but not limited to bad-block management, garbage collection, logical-to-physical address conversion, wear leveling, etc. In some implementations, memory controller 706 is further configured to process error correction codes (ECCs) with respect to the data read from or written to 3D memory device 704. Any other suitable functions may be performed by memory controller 706 as well, for example, formatting 3D memory device 704.

Memory controller 706 can communicate with an external device (e.g., host device 708) according to a particular communication protocol. For example, memory controller 706 may communicate with the external device through at least one of various interface protocols, such as a USB protocol, an MMC protocol, a peripheral component interconnection (PCI) protocol, a PCIexpress (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 706 and one or more 3D memory devices 704 can be integrated into various types of storage devices, for example, be included in the same package, such as a universal Flash storage (UFS) package or an eMMC package. That is, memory system 702 can be implemented and packaged into different types of end electronic products. In one example as shown in FIG. 7, memory controller 706 and a single 3D memory device 704 may be integrated into a memory card 702. Memory card 702 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc.

Implementations of the subject matter and the actions and operations described in this present disclosure can be implemented in digital electronic circuitry, in tangibly-embodied computer software or firmware, in computer hardware, including the structures disclosed in this present disclosure and their structural equivalents, or in combinations of one or more of them. Implementations of the subject matter described in this present disclosure can be implemented as one or more computer programs, e.g., one or more modules of computer program instructions, encoded on a computer program carrier, for execution by, or to control the operation of, data processing apparatus. The carrier may be a tangible non-transitory computer storage medium. Alternatively, or in addition, the carrier may be an artificially-generated propagated signal, e.g., a machine-generated electrical, optical, or electromagnetic signal, that is generated to encode information for transmission to suitable receiver apparatus for execution by a data processing apparatus. The computer storage medium can be or be part of a machine-readable storage device, a machine-readable storage substrate, a random or serial access memory device 400, or a combination of one or more of them. A computer storage medium is not a propagated signal.

It is noted that references in the present disclosure to "one embodiment," "an embodiment," "an example embodiment," "some embodiments," "some implementations," "one implementation," "an implementation," "an example implementation," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other implementations whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically noN+conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

As used herein, the term "nominal/nominally" refers to a desired, or target, value of a characteristic or parameter for a component or a process step, set during the design phase of a product or a process, together with a range of values above and/or below the desired value. As used herein, the range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., .+-.10%, .+-.20%, or .+-.30% of the value).

As used in this disclosure, the term "substantially" or "substantial" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

The present disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include implementations in which the first and second features may be in direct contact, and may also include implementations in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various implementations and/or configurations discussed.

The foregoing description of the specific implementations can be readily modified and/or adapted for various applications. Therefore, such adaptations and modifications are intended to be within the meaning and range of equivalents of the disclosed implementations, based on the teaching and guidance presented herein.

While the present disclosure contains many specific implementation details, these should not be construed as limitations on the scope of what is being claimed, which is defined by the claims themselves, but rather as descriptions of features that may be specific to particular implementations of particular inventions. Certain features that are described in this present disclosure in the context of separate implementations can also be implemented in combination in a single embodiment. Conversely, various features that are described in the context of a single embodiment can also be implemented in multiple implementations separately or in any suitable sub-combination. Moreover, although features may be described above as acting in certain combinations and even initially be claimed as such, one or more features from a claimed combination can in some cases be excised from the combination, and the claim may be directed to a sub-combination or variation of a sub-combination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations also are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The breadth and scope of the present disclosure should not be limited by any of the above-described exemplary implementations, but should be defined only in accordance with the following claims and their equivalents.

What is claimed is:

1. A circuit, comprising:

a memory configured to store an offset code that is predetermined; and a logic circuit configured to receive an impedance equilibrium (ZQ) calibration code as a first input and the offset code as a second input, and provide a resistor code as an output based on the ZQ calibration code and the offset code, wherein the offset code is independent from the ZQ calibration code, wherein a number of digits of the offset code is less than or equal to a number of digits of the ZQ calibration code.

2. The circuit of claim 1, wherein the logic circuit is configured to convert the ZQ calibration code to the resistor code by performing at least one of add, subtract, or shift on the ZQ calibration code.

3. The circuit of claim 1, wherein the resistor code is a sum of the ZQ calibration code and the offset code.

4. The circuit of claim 1, wherein the offset code comprises one binary digit, two binary digits or three binary digits.

5. The circuit of claim 1, wherein the offset code comprises at least one of a factory default code or a user-defined code.

6. The circuit of claim 1, wherein the memory comprises a register.

7. The circuit of claim 1, wherein the logic circuit comprises at least one of an adder, a subtractor, or a shifter.

8. The circuit of claim 1, wherein the resistor code is a RON_CODE, and the circuit is configured to provide the RON_CODE to one or more resistors to output data from a memory array.

9. The circuit of claim 1, wherein the resistor code is a RTT_CODE, and the circuit is configured to provide the RTT_CODE to one or more resistors to input data to a memory array.

10. The circuit of claim 1, wherein the circuit is configured to receive the ZQ calibration code from a ZQ calibration circuit.

11. A method, comprising:

receiving, as a first input of a logic circuit, an impedance equilibrium (ZQ) calibration code;

receiving, as a second input of the logic circuit, an offset code from a memory, the offset code being predetermined and stored in the memory, wherein the offset code is independent from the ZQ calibration code; and providing, as an output of the logic circuit, a resistor code based on the ZQ calibration code and the offset code, wherein a number of digits of the offset code is less than or equal to a number of digits of the ZQ calibration code.

12. The method of claim 11, wherein providing, as the output of the logic circuit, the resistor code comprises:

converting the ZQ calibration code to the resistor code by performing at least one of add, subtract, or shift on the ZQ calibration code.

13. The method of claim 11, wherein the resistor code is a sum of the ZQ calibration code and the offset code.

14. The method of claim 11, wherein the offset code comprises one binary digit, two binary digits or three binary digits.

15. The method of claim 11, wherein the offset code comprises at least one of a factory default code or a user-defined code.

16. The method of claim 11, comprising:

transmitting the resistor code to a buffer circuitry; and adjusting a resistance of one or more resistors in the buffer circuitry based on the resistor code.

17. The method of claim 16, wherein the resistor code is a RON_CODE, and wherein adjusting the resistance of the one or more resistors in the buffer circuitry based on the resistor code comprises:

adjusting the resistance of the one or more resistors in the buffer circuitry based on the RON_CODE to output data from a memory array.

18. The method of claim 16, wherein the resistor code is a RTT_CODE, and wherein adjusting the resistance of the one or more resistors in the buffer circuitry based on the resistor code comprises:

adjusting the resistance of the one or more resistors in the buffer circuitry based on the RTT_CODE to input data to a memory array.

19. A memory system, comprising:

a memory device configured to store data and comprising a memory array and a circuit, the circuit comprising:

a memory configured to store an offset code that is predetermined; and a logic circuit configured to receive a ZQ calibration code as a first input and the offset code as a second input, and provide a resistor code as an output based on the ZQ calibration code and the offset code, wherein the offset code is independent from the ZQ calibration code, and wherein a number of digits of the offset code is less than or equal to a number of digits of the ZQ calibration code; and a memory controller coupled to the memory device and configured to operate the memory device.

20. The memory system of claim 19, wherein the offset code comprises one binary digit, two binary digits or three binary digits.

* * * * *